United States Patent [19]
Miyanaga

[11] Patent Number: 5,284,779
[45] Date of Patent: Feb. 8, 1994

[54] METHOD OF FORMING ORGANIC CHARGE-TRANSFER THIN FILMS

[75] Inventor: Akiharu Miyanaga, Atsugi, Japan

[73] Assignee: Semiconductor Energy Laboratory Co., Ltd., Kanagawa, Japan

[21] Appl. No.: 915,395

[22] Filed: Jul. 20, 1992

Related U.S. Application Data

[63] Continuation of Ser. No. 617,196, Nov. 23, 1990, abandoned.

[30] Foreign Application Priority Data

Nov. 24, 1989 [JP] Japan .................. 1-305889

[51] Int. Cl.$^5$ .................. H01L 29/78; H01L 29/80
[52] U.S. Cl. .................. 437/1; 156/612; 313/504; 257/40; 257/642; 427/62; 437/970
[58] Field of Search .................. 257/40, 642; 313/504, 313/503

[56] References Cited

U.S. PATENT DOCUMENTS

| | | | |
|---|---|---|---|
| 4,672,265 | 6/1987 | Eguchi et al. | 313/504 |
| 4,725,513 | 2/1988 | Eguchi et al. | 428/690 |
| 4,737,232 | 4/1988 | Flicstein et al. | 156/610 |
| 4,803,011 | 2/1989 | Barraud et al. | 252/500 |
| 4,871,236 | 10/1989 | Gemma et al. | 350/355 |
| 4,939,556 | 7/1990 | Eguchi et al. | 357/4 |
| 4,940,516 | 7/1990 | Wegmann et al. | 204/14.1 |
| 5,153,681 | 10/1992 | Kishimoto et al. | 257/40 |
| 5,185,208 | 2/1993 | Yamashita et al. | 257/40 |

FOREIGN PATENT DOCUMENTS

| | | |
|---|---|---|
| 63-140576 | 6/1988 | Japan . |
| 1-209767 | 8/1989 | Japan .................. 257/40 |

OTHER PUBLICATIONS

Adachi et al., Appl. Phys. Lett., vol. 57, No. 6, Aug. 6, 1990, pp. 531–533.
Sweitzer et al., "Superconductivity in Polycrystalline Pressed Samples of Organic Metals", Solid State Communications, vol. 69, No. 8, Feb. 1989, pp. 843–845.

*Primary Examiner*—Robert Kunemund
*Assistant Examiner*—Ken Horton
*Attorney, Agent, or Firm*—Sixbey, Friedman, Leedom & Ferguson

[57] ABSTRACT

Superconducting or conducting organic charge-transfer complex film is epitaxially grown on a substrate which has been given an oriented surface by applying a stearic acid film. The periodic charge distribution over the oriented surface regulates the formation of the complex film to arrange the molecules along a common axis. The alignment of the molecules in the complex film helps to have superconductivity or high conductivities.

31 Claims, 5 Drawing Sheets

METHOD OF FORMING ORGANIC CHARGE-TRANSFER THIN FILMS

This application is a continuation of Ser. No. 07/617,196, filed Nov. 23, 1990, now abandoned.

BACKGROUND OF THE INVENTION

1. Field of the invention

The present invention relates to a method of forming charge-transfer thin films, more particularly relates to a method of forming organic superconducting or conducting thin films.

2. Description of the Prior Art

Since 1980 in which $(TMTSF)_2PF_6$ was reported for the first time as a superconducting material made from an organic substance having a critical temperature of 0.9K, several charge-transfer complexes have been confirmed to be superconducting, e.g. those comprising donor molecules such as TMTSF (tetramethyl-tetraselenefulvalene), TMTTF (tetramethyl-tetrathiafulvalene), BEDT-TTF (BEDT-TTF: Bis-(ethylenedithio)-tetrathiafulvalene) and those comprising acceptor molecules such as Ni(dmit). The critical temperature of $(BEDT-TTF)_2Cu(NCS)_2$ reaches as high as 11.0K for example. The organic superconducting materials of this kind are sorted out in first and second types. Superconducting materials of the first type are such that orbitals of $p\pi$ electrons are superimposed between molecules to form a column structure in a quasi-one dimensional structure. Superconducting materials of the second type are such that the anisotropy in molecular arrangement and the anisotropy in molecular orbital are readily balanced in order to form a quasi-two dimensional structure. Both types are characterized by anisotropy in a reduced dimensional structure. The critical temperatures of superconducting materials of the first type (one-dimensional) vary by application of pressure. For example, while Tc remains between 1.0K and 1.5K in the case of $\beta$-$(BEDT-TTF)_2I_3$ just after prepared, it has been reported that, when a pressure was applied to and then removed from the complex, the Tc was elevated by 7K.

These charge-transfer organic complexes exhibiting superconductivity are synthesized by methods utilizing solvents represented by diffusion or electrolysis methods. The sizes of crystals obtained by these methods, however, are very small and therefore it is difficult to use them for electronic appliances. Furthermore, at least one axes of respective crystals have to be aligned in a common direction in order to realize desired superconductivity as required for superconducting devices. Hitherto, several attempts such as utilizing evaporation, have been made to form organic superconducting thin films. The determination of deposition conditions for thin film formation of charge-transfer complexes become very difficult when the orientation of molecules has to be taken into consideration. In fact, the epitaxial growth of an organic charge-transfer complex can not easily take place on a substrate by procedures employed in conventional processes, unlike the conventional deposition of an inorganic film on an inorganic substrate, so that many deposition conditions such as the distance between the substrate to be coated and the target have to be simultaneously satisfied in order to achieve desired alignment of molecules of the charge-transfer complex so that reproductivity can hardly be obtained.

BRIEF SUMMARY OF THE INVENTION

It is an object of the present invention to provide a method of making organic superconducting or conducting organic films which have been given good molecular orientation.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other objects, and in accordance with the present invention, as embodied and broadly described herein, the surface of a substrate on which a superconducting or conducting organic complex film should be deposited is coated with a buffer film such as made from stearic acid or another suitable material. The molecules of stearic acid possess a polarity and, when aligned in a regular arrangement, the poles of the molecules are arranged as illustrated in FIG. 1 to form a periodic distribution of electric changes. Namely, the substrate is provided with an oriented surface. The organic complex is deposited thereon with a molecular regularity in accordance with the pole arrangement of the underlying stearic acid since the molecules of the complex also have a certain polarity. In other words, the charge distribution of stearic acid at the surface regulates the orientation of the molecules of the complex. Of course, the inner condition of the stearic acid film is not so important as long as the upper surface provides ordered charge distribution. The stearic acid film is prepared desirably by the LB method using a stearic acid solution. The LB film is a single-layered molecular (monomolecular) film which tends to be formed with the periodic arrangement of poles of the molecules. In this regard, the pH of the stearic acid is suitably adjusted to obtain a good surface condition (periodic charge distribution over the surface).

When $(BEDT-TTF)_2I_3$, $(BEDT-TTF)_2Cu(SCN)_2$, $(TMTSF)_2ClO_4$ and the like are used as the charge-transfer complex, well-ordered molecular structure brings superconductivity. When $(TTF)x(TSNQ)y$, $(TMTTF)x(TCNQ)y$, $(TSF)x(TCNQ)y$, $(TMTSF)x(TCNQ)y$ and the like are used as the charge-transfer complex, well-ordered molecular structure brings high conductivities. These acronyms stand for:

TTF: tetrathiafulvalene

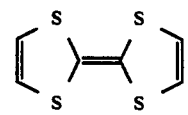

TMTTF: tetramethyltetrathiafulvalene

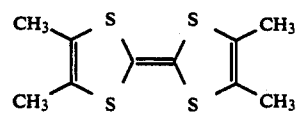

TSF: tetraselenafulvalene

-continued

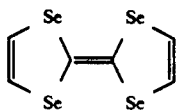

TMTSF: tetramethyltetraselenafulvalene

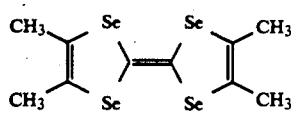

TCNQ: tetracyanoquinodimethane

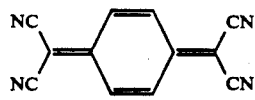

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 2:
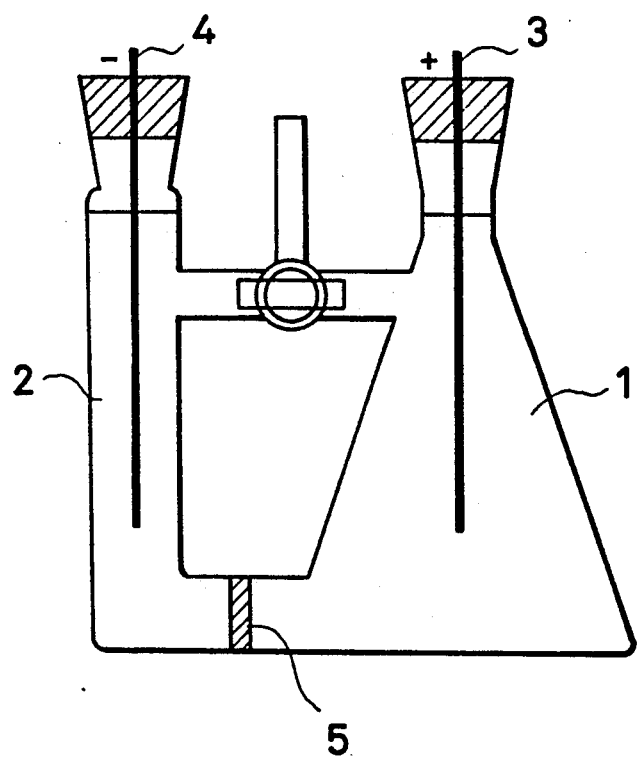
FIG. 2 is a schematic diagram showing an apparatus used for preparation of charge-transfer complexes.

First, a charge-transfer complex is prepared to obtain an evaporation source. Electrolysis, diffusion and the like are employed since the complex in the form of fine crystals can be used for the purpose of evaporation in accordance with the present invention. In this embodiment, electrolysis is used for forming $(BEDT-TTF)_2I_3$ crystals. FIG. 2 is a schematic view showing a method of preparing $(BEDT-TTF)_2I_3$ by electrolysis. The inside of a glass flask is partitioned into first and second regions 1 and 2 by a semipermeable membrance 5. The first region 1 is filled with TCE (1,1,2-trichloroethane) in which BEDT-TTF is dissolved. The second region 2 is filled with TCE in which $TBA.I_3$ (TBA: tetrabuthylammonium) is dissolved. Platinum electrodes 3 and 4 are dipped in the regions 1 and 2 as a cathode and an anode. An electric current of 1 to 500 $\mu A$ is passed between these electrodes 3 and 4 and maintained for 1 to 7 days. The temperature of these solution is kept at 20° C. to 25° C. As a result, crystalline $(BEDT-TTF)_2I_3$ is grown on the electrode 3. Although the grain size of the crystals is substantially small, these are sufficient for the purposes of the present invention. The crystalline $(BEDT-TTF)_2I_3$ is deposited on a substrate by evaporation in a later step.

Figure 1:
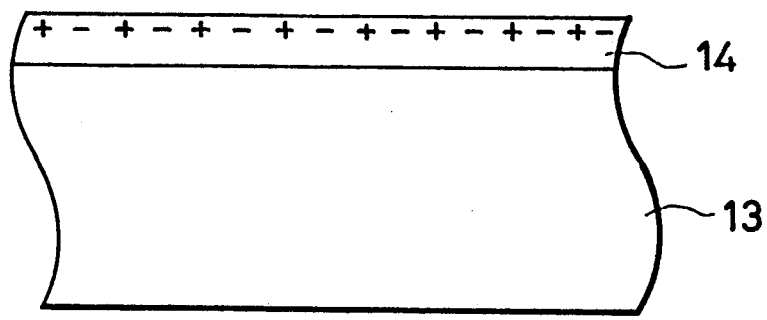
FIG. 1 shows the surface condition of a stearic acid film.
Figure 6:
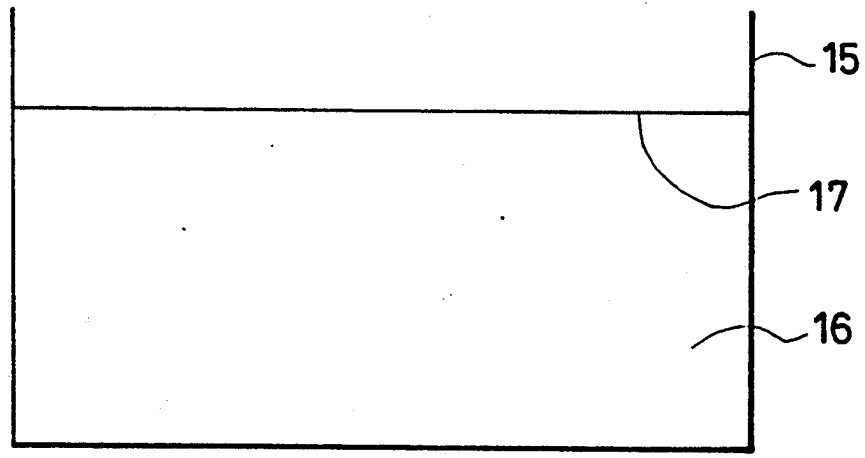
FIG. 6 is a schematic view showing a vessel in accordance with the present invention.

In advance of deposition of the crystalline $(BEDT-TTF)_2I_3$, a stearic acid film is applied as a buffer film by LB (Langmuir-Blodgett) technique to the surface of a substrate 13 to be coated. LB technique is explained for beginners in a book "Design of Molecular of LB Film" printed in Japan by Kyouritsu Shuppan Co., Ltd. (The writer is Mr. Keiji Iriyama.) The substrate 13 is for example a silicon semiconductor substrate whose surface has been cleaned by putting it in HF solution and applying ultrasonic waves for 10 minutes in order to remove $SiO_2$ films formed on the substrate 13. A monomolecular film 17 of stearic acid is formed by gradually applying a pressure on stearic molecules extending over the surface of a water solution 16 of stearic acid in a vessel 15. The pH of the solution 16 is maintained at 6 to 7 by controlling the temperature of the solution 16, i.e. 5° C. to 10° C. By adjusting the pH at 6-7, the surface condition of the stearic acid film 14 is maintained at its electrically neutral state so as to achieve periodical charge distribution as illustrated in FIG. 1. If the pH is deflected to more acidity or alkalinity, the surface condition is degraded. The monomolecular film (LB film) 17 is transferred to the surface of the substrate 13 by moving the substrate 13 across the surface of the solution 16. By this method, monomolecular films can be formed on large substrates without disturbance of molecular arrangement.

Figure 3:
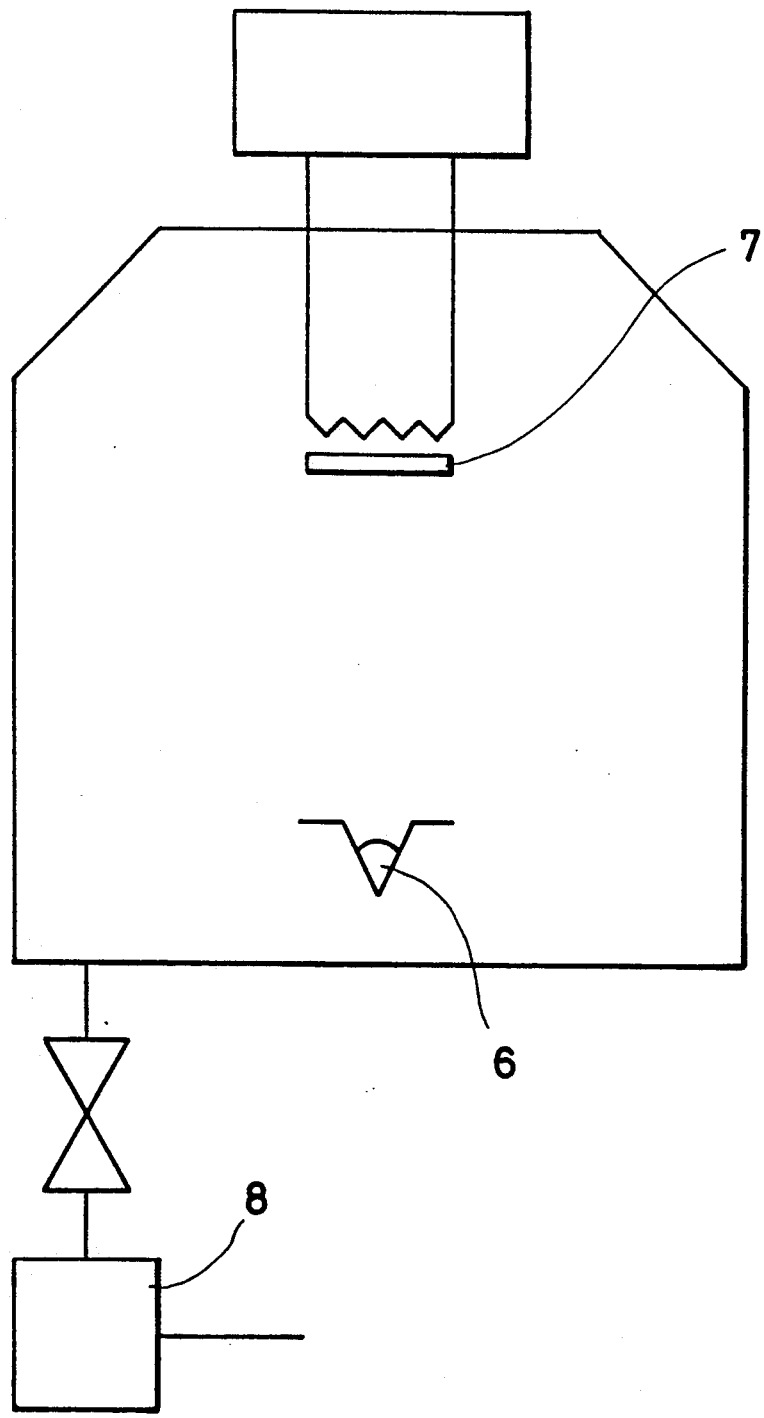
FIG. 3 is a schematic diagram showing an apparatus used for deposition of charge-transfer complexes by evaporation in accordance with the present invention.

A thin film of $(BEDT-TTF)_2I_3$ is formed on the stearic acid surface of the substrate by evaporation in the apparatus illustrated in FIG. 3. The crystalline $(BEDT-TTF)_2I_3$ prepared by the above method is disposed in the apparatus as an evaporation source designated by numeral 6. The substrate coated with the stearic acid film is located opposite to the source 6 as designated by numeral 7. The temperature of the substrate 7 is maintained at room temperature to 50° C. and the temperature of the source 6 is at 250° C. to 300° C. during evaporation. These temperatures are determined no higher than the decomposition temperatures of $(BEDT-TTF)_2I_3$ and stearic acid respectively. The pressure inside of the apparatus is kept at $10^{-9}$ Torr to $10^{-10}$ Torr by means of an evacuation system 8. In accordance with experiments, it was confirmed that the $(BEDT-TTF)_2I_3$ thin film thus deposited was epitaxially grown and consisted of well-aligned crystals by XRD (X-ray diffraction analysis). Also, it was confirmed that there is no appreciable difference between the compositions of the source and the epitaxial film. The critical temperature of superconductivity of the epitaxial film was 1.0K.

Figure 4:
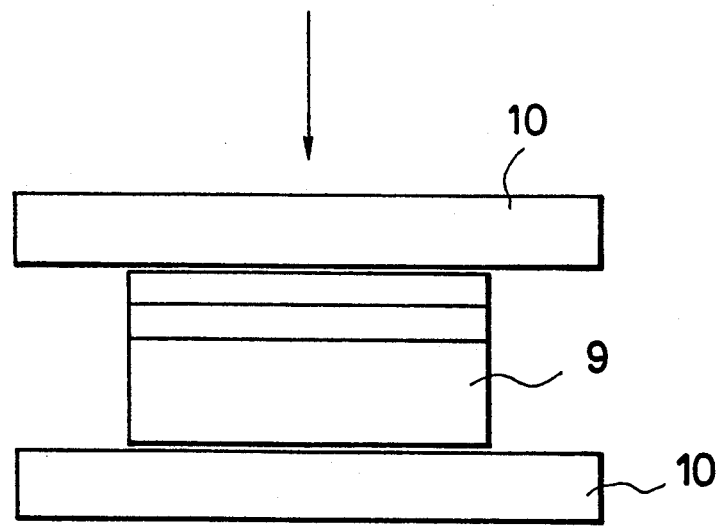
FIG. 4 is an explanatory view showing how to apply pressure to superconducting thin film deposited on a substrate in accordance with the present invention.

The $(BEDT-TTF)_2I_3$ film is then compressed between a pair of metallic plates 10 having smooth surfaces as illustrated in FIG. 4 in order to elevate the critical temperature thereof. The pressure of the compression is gradually increased up to 3.5 Kbar. This process is carried out in air at room temperature and the compressed condition is kept for 8 hours. Thereafter, the two plates are removed to release the substrate from pressure. By this compression, the critical temperature is improved to 3K to 4K. Since the decomposition temperature of the stearic acid is sufficiently low as compared to that of $(BEDT-TTF)_2I_3$, the stearic acid film can be removed only by heating it in order to obtain the thin film of $(BEDT-TTF)_2I_3$ itself.

Next, another embodiment of the invention will be explained. Crystalline $(BEDT-TTF)_2I_3$ is prepared by a conventional diffusion method or an electrolysis method as described above. A silicon semiconductor substrate is cleaned by HF solution and coated with stearic acid in the same manner as the above embodiment. The coating process, however, is repeated for 3 or 4 times in order to laminate a 3- or 4-layer stearic film. Namely, the lamination is carried out by raising and lowering the substrate across the surface of a stearic acid solution at which a monomolecular film of stearic acid is formed. The pH of the stearic acid solution is maintained at 6 to 7 like the preceding embodiment. By this lamination, the uppermost stearic layer is prevented from the influence of imperfection of unevenness appearing at the surface of the silicon substrate, providing an excellent surface suitable for epitaxial growth of (BEDT-TTF)$_2$I$_3$ by evaporation.

A (BEDT-TTF)$_2$I$_3$ film is then deposited on the multilayered stearic acid film in the same manner as the previous embodiment. A well aligned complex film is therefore deposited in light of the buffer of the stearic acid film. The critical temperature of the complex film is about 1.5K. The (BEDT-TTF)$_2$I$_3$ film is then compressed between the pair of metallic plates 10 having smooth surfaces as illustrated in FIG. 4 in the same manner. The pressure of the compression is gradually increased up to 2 Kbar. This process is carried out in air at room temperature and the compressed condition is kept for 10 hours. Thereafter, the two plates are removed to release the substrate from pressure. By this compression, the critical temperature is improved to 6K to 8K.

Figure 5:
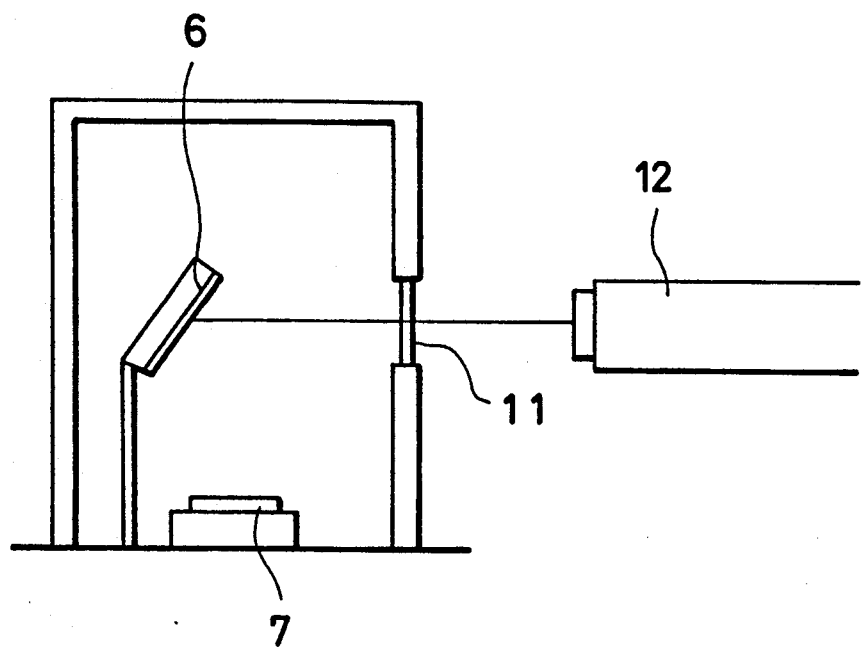
FIG. 5 is a schematic diagram showing an apparatus used for deposition of charge-transfer complexes by laser evaporation in accordance with the present invention.

Next, a further embodiment will be described. The formation of crystalline (BEDT-TTF)$_2$I$_3$ and the lamination of multi-layered stearic acid film on a cleaned silicon substrate are carried out in the same manner as the preceding embodiment. The characteristics of this embodiment reside in the employment of laser evaporation in which energy of laser rays is used instead of the direct thermal energy. The evaporation apparatus for this purpose is schematically illustrated in FIG. 5 in which an evacuation system, gas introduction ports and so forth necessary for the evaporation are omitted from the illustration. A evaporation source of (BEDT-TTF)$_2$I$_3$ is designated by numeral 6 and the substrate by numeral 7. The source 6 is exposed through a transparent window 11 to pulsed laser rays emitted from an Nd-YAG laser 12 (wavelength=1.064 $\mu$m). Of course, other type of lasers can be used, e.g. a CO$_2$ laser or the like capable of emitting laser rays in the wavelength region of infrared rays. The pulse width is desirably no wider than ten milliseconds, e.g. one millisecond. By this embodiment, it is avoided that when the substrate is continuously heated by a heater, organic superconducting materials such as (BEDT-TTF)$_2$I$_3$ tend to be partially decomposed because the decomposition temperature thereof is substantially low.

The output power of the laser 12 is desirably controlled as low as possible in order to maintain the temperature of the source 6 at 250° C. to 300° C. since the decomposition temperature is substantially low. The control of the temperature is done only by adjusting the output power of the laser and the irradiation time in this embodiment. The control, however, may be carried out by the use of a suitable coolant such as liquid nitrogen depending on the case. The pressure in the apparatus is kept at no higher than 10$^{-2}$ Torr and the substrate temperature at room temperature to 50° C. during evaporation. The critical temperature of the (BEDT-TTF)$_2$I$_3$ film thus epitaxially grown is about 1.5K. The complex film is then compressed between the pair of metallic plates 10 having smooth surfaces as illustrated in FIG. 4 in the same manner. The pressure of the compression is gradually increased up to 1.3 Kbar. This process is carried out in air at room temperature and the compressed condition is kept for 5 hours. Thereafter, the two plates are removed to release the substrate from pressure. By this compression, the critical temperature is improved to 7K to 8K.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Although the embodiments are described to utilize (BEDT-TTF)$_2$I$_3$ as the superconducting complex, other charge-transfer complexes such as (BEDT-TTF)$_2$Cu(SCN)$_2$ and (TMTSF)$_2$ClO$_4$ can be used in the same manner. Also, the buffer film can be formed from other suitable materials than stearic acid as long as ordered surfaces can be formed. For example, a stearic acid metallic salt film such as (CH$_3$(CH$_2$)$_{16}$COO)$_2$Ca film may be used as the buffer film. The method of forming these buffer films is not limited to the LB method. For example, sputtering, vapor deposition such as CVD and PVD, polymerization and so on can be used for this purpose. In this connection, a magnetic field may be applied across the complex during deposition, if desired, in order to help the orientation of the molecules. Although silicon substrates are used in the above embodiments, other suitable substrates such as glass, mg substrates can be used as long as a buffer film can adhere thereto. The present invention can be applied to other type charge-transfer organic films and be useful in order to prepare organic films having high conductivities even non-superconducting. Also the present invention can be applied to a superlattice film which is a multi-layer comprising one or more organic neutral planar molecule layers and one or more metallic layers formed alternatively. In this case, an organic neutral planar molecule layer should be formed directly on a buffer layer of the present invention in order to form the superlattice film with a good molecular orientation. The one or more organic neutral planar molecule layers may be comprised of a common molecule such as TCNQ (tetracyanoquinodimethane), TCNQ derivatives, TMTTF, TMTSF, TNAP, HMTTF, DMPTTF, NMP, TTF, and TTF derivatives. The one or more metallic layers may be comprised of a common metallic element such as aluminum, indium, and gold. A superlattice film having extremely high conductivity can be obtained since the organic neutral planar molecule layer formed directly on a buffer layer of the present invention is given a good molecular orientation by virtue of an oriented surface of the buffer layer.

What is claimed is:

1. A method for forming an organic film comprising the steps of:
    forming an organic buffer film on a substrate with the molecules of said film oriented by Langmuir-Blogett's technique;

forming a charge-transfer organic film on said buffer film by vapor depositions wherein said buffer film is stearic acid metallic salt.

2. A method for forming an organic film of claim 1 wherein said organic film is selected to possess superconductivity.

3. A method for forming an organic film of claim 1 wherein said organic buffer film is made from stearic acid and/or stearic acid metallic salt.

4. A method for forming an organic film of claim 1 wherein said charge-transfer film is a $(BEDT-TTF)_2I_3$ film.

5. A method for forming an organic film of claim 1 wherein said charge-transfer organic film is formed by evaporating a charge-transfer source at a temperature from 250° C. to 300° C.

6. A method for forming an organic film of claim 4 wherein a temperature of said substrate is from room temperature to 50° C.

7. A method for forming an organic film of claim 1 wherein a solution of said stearic acid prepared at a pH from 6 to 7 is used for said Langmuir-Blodgett's technique.

8. A method for forming an organic film of claim 1 wherein said stearic acid film forming step is repeated in order to laminate said stearic acid film in the form of a multi-layer comprising stearic acid monomolecular layers.

9. A method for forming an organic film of claim 1 further comprising a step of pressing said charge-transfer organic film.

10. A method for forming an organic film of claim 1 wherein said charge-transfer film is $(BEDT-TTF)_2Cu(SCN)_2$ or $(TMTSF)_2ClO_4$.

11. A method for forming an organic film comprising the steps of:
forming an organic buffer film on a substrate with the molecules of said film oriented by vapor deposition;
forming a charge-transfer organic film on said buffer film by vapor deposition wherein said buffer film is stearic acid metallic salt.

12. A method for forming an organic film of claim 11 wherein said charge-transfer film is $(BEDT-TTF)_2I_3$.

13. A method for forming an organic film of claim 11 wherein said charge-transfer organic film is formed by evaporating a charge-transfer source at a temperature from 250° C. to 350° C.

14. A method for forming an organic film of claim 11 wherein a temperature of said substrate is from room temperature to 50° C.

15. A method for forming an organic film of claim 11 further comprising a step of pressing said charge-transfer film.

16. A method for forming an organic film of claim 11 wherein said charge-transfer film is $(BEDT-TTF)_2Cu(SCN)_2$ or $(TMTSF)_2ClO_4$.

17. A method for forming an organic film of claim 3 wherein said stearic acid and/or stearic acid metallic salt film has a molecular arrangement that stearic acid and/or stearic acid metallic salt molecules are oriented substantially in a direction perpendicular to said substrate.

18. A method for forming an organic film of claim 3 wherein said stearic acid and/or stearic acid metallic salt film has a molecular arrangement that stearic acid and/or stearic acid metallic salt molecules are oriented substantially in a direction parallel to said substrate.

19. A method for forming a superlattice film comprising the steps of:

forming an organic buffer film on a substrate with an oriented surface wherein said buffer layer is stearic acid metallic salt;
forming a superlattice film on said organic buffer film, said superlattice film being a multi-layer comprising one or more organic neutral planar molecule layers and one or more metallic layers formed alternatively with one of said one or more organic neutral planar molecule layers formed directly on said organic buffer film.

20. A method for forming a superlattice film of claim 19 wherein said one or more metallic layers are comprised of a common metallic element.

21. A method for forming a superlattice film of claim 20 wherein said common metallic element is aluminum, indium, or gold.

22. A method for forming a superlattice film of claim 19 wherein said one or more organic neutral planar molecule layers are multi-layers comprising organic neutral planar monomolecular layers, respectively.

23. A method for forming a superlattice film of claim 22 wherein said one or more organic neutral planar molecule layers are comprised of a common molecule selected from the group consisting of TCNQ, TCNQ derivatives, TMTTF, TMTSF, TNAP, TTF, TTF derivatives, NMP, HMTTF, and DMPTTF.

24. A method for forming an organic superconducting film of claim 3 wherein said stearic acid metallic salt film is a $(CH_3(CH_2)_{16}COO)_2Ca$ film.

25. A method for forming an organic film of claim 11 wherein said organic film is selected to possess superconductivity.

26. A method for forming an organic film of claim 11 wherein said organic buffer film is made from stearic acid and/or stearic acid metallic salt.

27. A method for forming an organic film of claim 26 wherein said stearic acid and/or stearic acid metallic salt film has a molecular arrangement that stearic acid and/or stearic acid metallic salt molecules are oriented substantially in a direction perpendicular to said substrate.

28. A method for forming an organic film of claim 26 wherein said stearic acid and/or stearic acid metallic salt film has a molecular arrangement that stearic acid and/or stearic acid metallic salt molecules are oriented substantially in a direction parallel to said substrate.

29. A method for forming an organic film of claim 26 wherein said stearic acid metallic salt film is a $(CH_3(CH_2)_{16}COO)_2Ca$ film.

30. A method for forming an organic film comprising the steps of:
forming an organic buffer film on a substrate with the molecules of said film oriented by Langmuir-Blodgett's technique; and
forming a charge-transfer organic film on said buffer film by vapor deposition,
wherein said organic buffer film has a molecular arrangement in which molecules thereof are oriented substantially in a direction parallel to said substrate.

31. A method for forming an organic film comprising the steps of:
forming an organic buffer film on a substrate with the molecules of said film oriented by vapor deposition;
forming a charge-transfer organic film on said buffer film by vapor deposition,
wherein said organic buffer film has a molecular arrangement in which molecules thereof are oriented substantially in a direction parallel to said substrate.

* * * * *